(12) United States Patent
Ionescu

(10) Patent No.: US 11,799,409 B2
(45) Date of Patent: Oct. 24, 2023

(54) MEDIUM VOLTAGE VARIABLE FREQUENCY DRIVE WITH ARTIFICIAL INTELLIGENCE

(71) Applicant: SIEMENS AKTIENGESELLSCHAFT, Munich (DE)

(72) Inventor: Bogdan Cristian Ionescu, Carlsbad, CA (US)

(73) Assignee: Siemens Aktiengesellschaft, Munich (DE)

( * ) Notice: Subject to any disclaimer, the term of this patent is extended or adjusted under 35 U.S.C. 154(b) by 338 days.

(21) Appl. No.: 17/310,339

(22) PCT Filed: Mar. 4, 2019

(86) PCT No.: PCT/US2019/020506
§ 371 (c)(1),
(2) Date: Jul. 28, 2021

(87) PCT Pub. No.: WO2020/180293
PCT Pub. Date: Sep. 10, 2020

(65) Prior Publication Data
US 2022/0060134 A1    Feb. 24, 2022

(51) Int. Cl.
*H02M 7/483* (2007.01)
*H02P 27/06* (2006.01)
(Continued)

(52) U.S. Cl.
CPC ........... *H02P 27/06* (2013.01); *H02M 7/003* (2013.01); *H05K 7/209* (2013.01); *H05K 7/20927* (2013.01)

(58) Field of Classification Search
CPC .... H02M 7/003; H02M 1/0077; H02M 1/327; H02M 7/49; H02M 5/458
See application file for complete search history.

(56) References Cited

U.S. PATENT DOCUMENTS

| | | | |
|---|---|---|---|
| 10,030,801 B2 * | 7/2018 | Radan | E21B 36/04 |
| 2016/0006364 A1 | 1/2016 | Zhou et al. | |
| 2017/0299123 A1 * | 10/2017 | Fowler | F04D 15/00 |

FOREIGN PATENT DOCUMENTS

WO    2014134763 A1    9/2021

OTHER PUBLICATIONS

Markus Andresen et al: "Computational light junction temperature estimator for active thermal control", 2016 IEEE Energy Conversion Congress and Exposition (ECCE), Sep. 1, 2016 (Sep. 1, 2016), pp. 1-7.

(Continued)

*Primary Examiner* — Muhammad S Islam

(57) ABSTRACT

A variable frequency drive system includes a power converter with a plurality of power cells supplying power to one or more output phases, each power cell having multiple switching devices incorporating semiconductor switches; a plurality of sensors monitoring values of the power converter; and a control system in communication with the power converter and controlling operation of the plurality of power cells, the control system comprising a processor configured via executable instructions to access a first reduced order model of the power converter; receive the values provided by the plurality of sensors; analyze the values in connection with the first reduced order model to determine one or more operating modes; and output one or more determined operating modes of the power converter.

20 Claims, 6 Drawing Sheets

(51) Int. Cl.
*H02M 7/00* (2006.01)
*H05K 7/20* (2006.01)

(56) References Cited

OTHER PUBLICATIONS

Sumit Dutta et al: "Development of a predictive observer thermal model for power semiconductor devices for overload monitoring in high power high frequency converters", 2012 Twenty-Seventh Annual IEEE Applied Power Electronics Conference and Exposition (APEC), Feb. 1, 2012 (Feb. 1, 2012), pp. 2305-2310.
Johannes Falck et al: "Active thermal control of IGBT power electronic converters", IECON 2015, 41st Annual Conference of the IEEE Industrial Electronics Society, Nov. 1, 2015 (Nov. 1, 2015), pp. 000001-000006.
PCT International Search Report and Written Opinion of International Searching Authority dated Oct. 23, 2019 corresponding to PCT International Application No. PCT/US2019/020506 filed Mar. 4, 2019.

\* cited by examiner

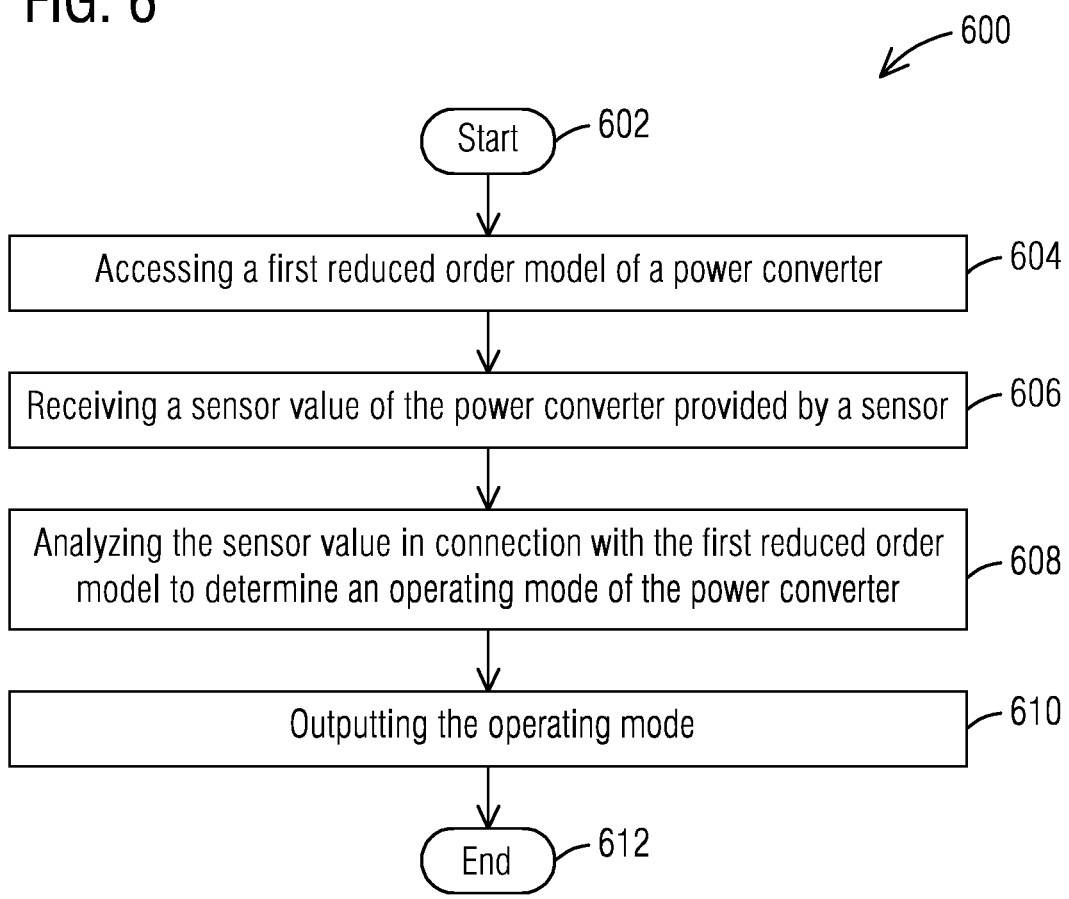

MEDIUM VOLTAGE VARIABLE FREQUENCY DRIVE WITH ARTIFICIAL INTELLIGENCE

BACKGROUND

1. Field

Aspects of the present disclosure generally relate to a drive system with artificial intelligence, specifically a control system and control method for a drive system, such as a medium voltage variable frequency drive. Throughout the specification, the terms "drive", "drive system", "converter" and "power supply" can be used interchangeably.

2. Description of the Related Art

Medium voltage (MV) variable frequency drives, such as for example multilevel power converters, are used in applications of medium voltage alternating current (AC) drives, flexible AC transmission systems (FACTS), and High Voltage DC (HVDC) transmission systems, because single power semiconductor devices cannot handle high voltage. Multilevel power converters typically include a plurality of power cells for each phase, each power cell including an inverter circuit having semiconductor switches that are capable of altering the voltage output of the individual cells.

One example of a multilevel power converter is a cascaded H-bridge converter system having a plurality of H-bridge cells as described for example in U.S. Pat. No. 5,625,545 to Hammond, the content of which is herein incorporated by reference in its entirety. Another example of a multilevel power converter is a modular multilevel converter system having a plurality of M2C or M2LC subsystems.

Medium voltage drives contain a purpose specific digital control system. The digital control system splits the tasks of control loop command and status, power cell control information and external communications interface into three separate components. The three separate main components are a control processor/host central processing unit for control loop commands, status and non-drive interfaces, a field programmable gate array (FPGA) for power cell control and communications, and an electronically programmable logic device (EPLD) for external communication. The main components require a dedicated data bus on a printed circuit board (PCB) so that the main components can exchange information between them for a successful operation of the drive system.

SUMMARY

Briefly described, aspects of the present disclosure relate to a drive system, embodied for example as a medium voltage variable frequency drive, and more specifically to a control system and control method for a drive system.

A first aspect of the present disclosure provides a variable frequency drive system comprising a power converter comprising a plurality of power cells supplying power to one or more output phases, each power cell comprising multiple switching devices incorporating semiconductor switches; a plurality of sensors monitoring values of the power converter; and a control system in communication with the power converter and controlling operation of the plurality of power cells, the control system comprising at least one processor configured via executable instructions to access a first reduced order model of the power converter; receive the values provided by the plurality of sensors; analyze the values in connection with the first reduced order model to determine one or more operating modes; and output one or more determined operating modes of the power converter.

A second aspect of the present disclosure provides a method for controlling a variable frequency drive comprising through operation of at least one processor: accessing a reduced order model of a power converter; receiving a sensor value of the power converter provided by a sensor; analyzing the sensor value in connection with the reduced order model to determine an operating mode of the power converter; and outputting the operating mode.

A third aspect of the present disclosure provides a non-transitory computer readable medium encoded with processor executable instructions that when executed by at least one processor, cause the at least one processor to carry out a method for controlling a variable frequency drive as described herein.

BRIEF DESCRIPTION OF THE DRAWINGS

FIG. 6 illustrates a flow chart of a method for controlling a variable frequency drive in accordance with an exemplary embodiment of the present disclosure.

DETAILED DESCRIPTION

To facilitate an understanding of embodiments, principles, and features of the present invention, they are explained hereinafter with reference to implementation in illustrative embodiments. In particular, they are described in the context of being a control system for a variable frequency drive, in particular medium voltage (MV) variable frequency drives including multi-cell power supplies such as modular multilevel converter systems and cascaded H-bridge converter systems. Embodiments of the present invention, however, are not limited to use in the described devices or methods.

As used herein, a "medium voltage" is a voltage of greater than about 690V and less than about 69 KV, and a "low voltage" is a voltage less than about 690V. Persons of ordinary skill in the art will understand that other voltage levels may be specified as "medium voltage" and "low voltage". For example, in some embodiments, a "medium voltage" may be a voltage between about 3 kV and about 69 kV, and a "low voltage" may be a voltage less than about 3 kV.

The components and materials described hereinafter as making up the various embodiments are intended to be illustrative and not restrictive. Many suitable components and materials that would perform the same or a similar function as the materials described herein are intended to be embraced within the scope of embodiments of the present invention.

Figure 1:
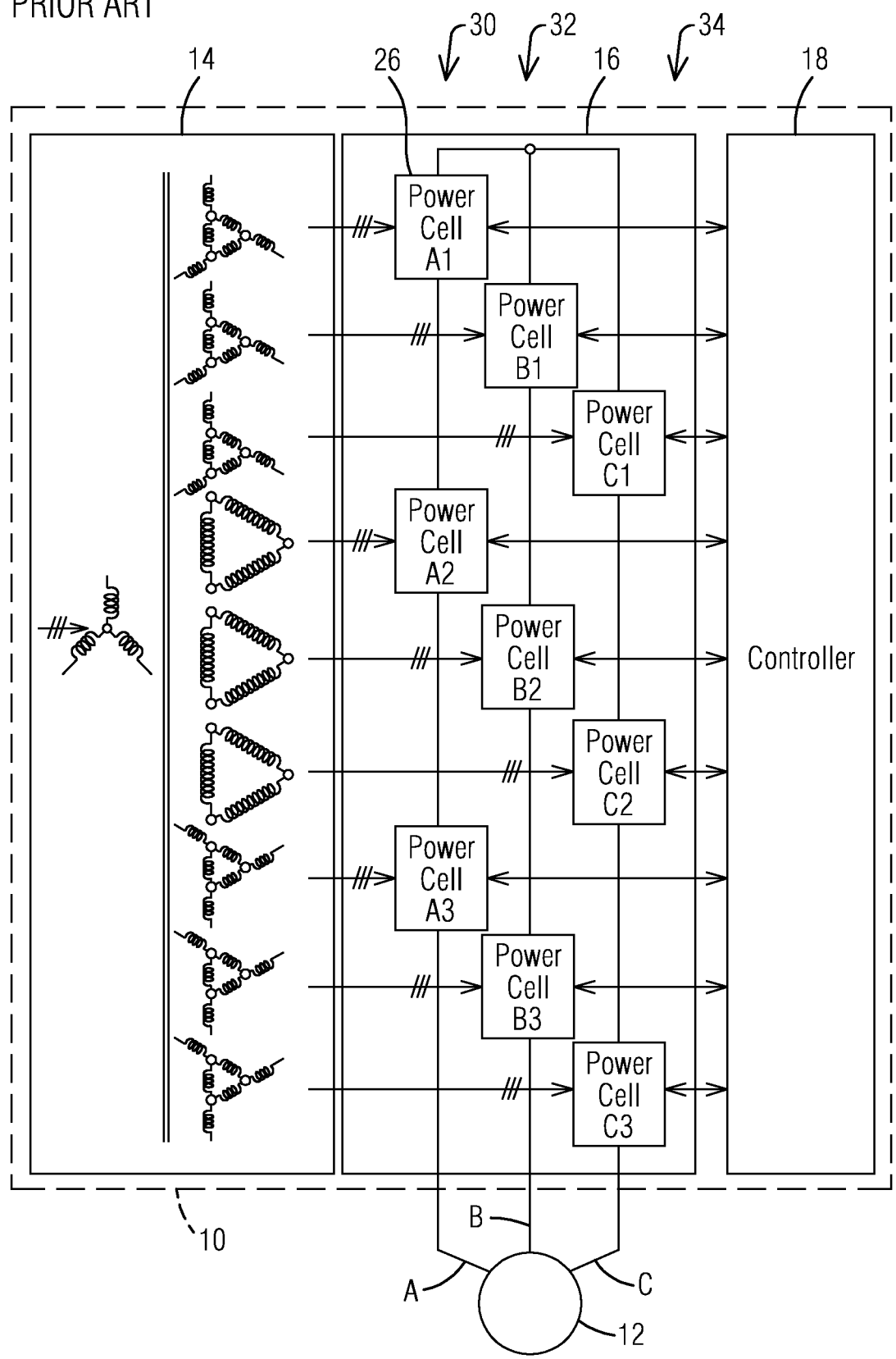
FIG. 1 illustrates a schematic diagram of a known basic configuration of a cascaded H-bridge converter system in accordance with an exemplary embodiment disclosed herein.
Figure 2:
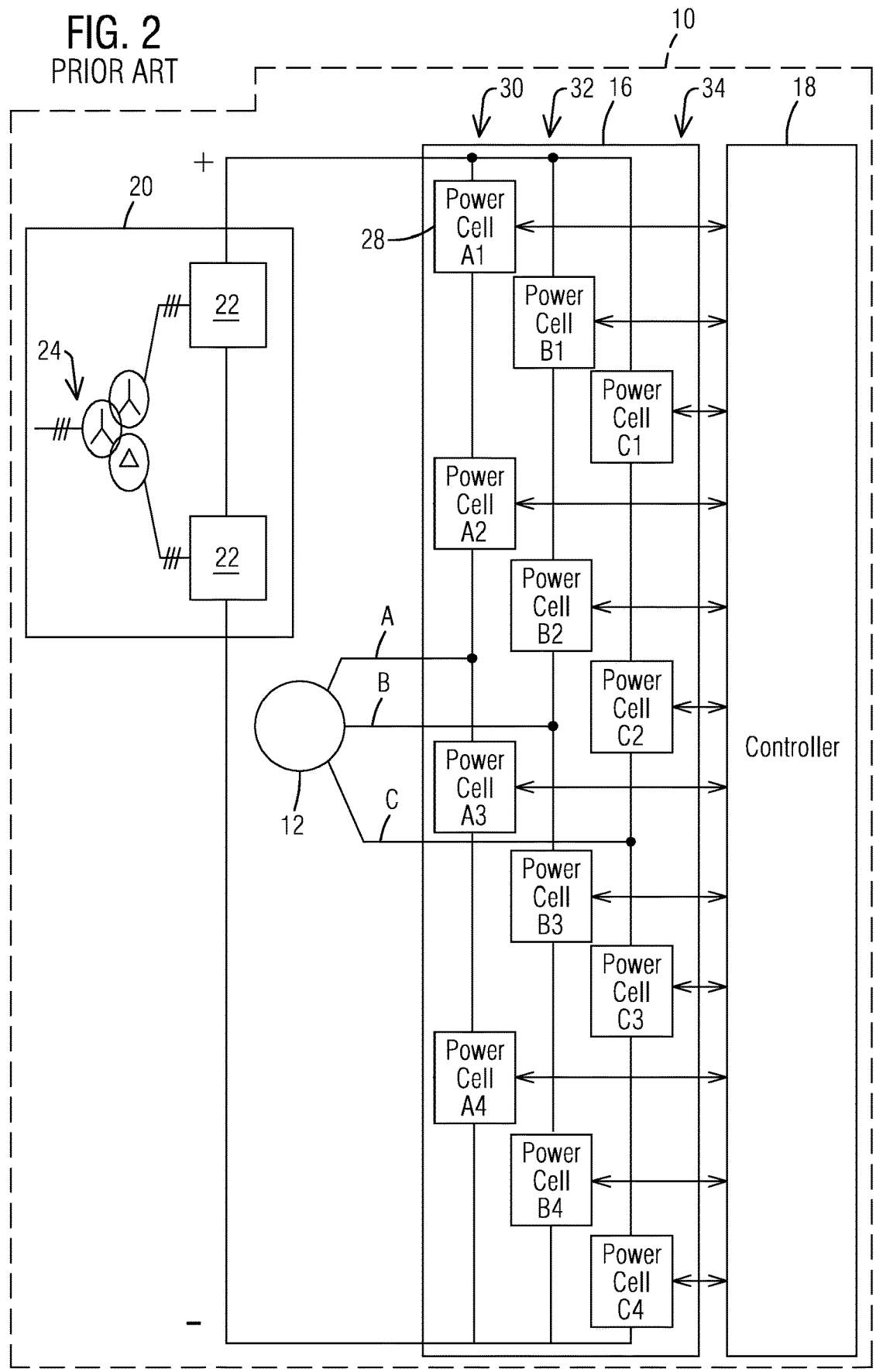
FIG. 2 illustrates a schematic diagram of another known basic configuration of a cascaded H-bridge converter system in accordance with an exemplary embodiment disclosed herein.

FIG. 1 and FIG. 2 each illustrate a schematic of a known multi-cell power supply 10, specifically a cascaded H-bridge converter system that receives three-phase power from an alternating current (AC) source, and delivers power to a load 12, e.g., a three-phase AC motor.

With reference to FIG. 1, the multi-cell power supply 10 includes a transformer 14, a power circuit 16, and a controller 18, herein also referred to as control system. The transformer 14 includes a primary winding that excites nine secondary windings, and power circuit 16 includes multiple printed circuit board (PCB) power cells 26, herein simply referred to as power cells 26, that are operably coupled to the secondary windings, respectively, of the transformer 14. As the power supply 10 comprises nine secondary windings, and a power cell 26 is operably coupled to each secondary winding, the power supply 10 comprises nine power cells 26. Of course, the power supply 10 can comprise more or less than nine power cells 26 and/or more or less than nine secondary windings depending on a type of the power supply 10 and/or a type of the load 12 coupled to the power supply 10.

The power cells 26 can be rated for lower voltages and are configured to provide a medium voltage output to the load 12. Each output phase A, B, C of the power circuit 16 is fed by a group of series-connected power cells 26. Outputs of the power cells 26 are coupled in series in a first phase group 30, at second phase group 32, and a third phase group 34. Each phase output voltage is a sum of the output voltages of the power cells 26 in the respective phase group 30, 32 and 34. For example, the first phase group 30 comprises power cells 26 labelled A1, A2 and A3, wherein the phase output voltage of the output phase A is the sum of the output voltages of the power cells A1, A2 and A3. The same applies to output phase B and power cells B1, B2, B3, and output phase C and power cells C1, C2, C3. In this regard, the power circuit 16 delivers a medium voltage output to load 12 using lower voltage rated power cells 26 that include components rated to lower voltage standards. Each power cell 26 is coupled, e.g., for example via an optical fiber communication link, to controller 18, which may use current feedback and voltage feedback to control operation of the power cells 26.

As illustrated in FIG. 2, a multi-cell power supply 10 includes three-phase AC power supply 20, a power circuit 16, and a controller 18. The three-phase AC power supply 20 includes two diode bridges 22 which are each connected on the AC voltage side to secondary windings of a power converter transformer 24 and are electrically connected in series on a direct current (DC) voltage side. A positive and a negative DC voltage bus are provided for the parallel connection of these phase groups. The power circuit 16 includes power cells 28 that are coupled to the DC voltage bus created by the power supply 20. The power cells 28 are for example lower voltage rated and are configured to provide medium voltage output to load 12. Although the load 12 may be illustrated as being within the multi-cell power supply 10, the load 12 is not part of the multi-cell power supply 10. Rather, the load 12 is separate from, and connected to, the multi-cell power supply 10, as more clearly shown in FIG. 1.

Each output phase A, B, C of the power circuit 16 is fed by a group of series-connected power cells 28, also labelled A1-A4, B1-B4 and C1-C4 with reference to the output phases A, B, C. The power cells 28 are coupled in series in a first phase group 30, a second phase group 32, and a third phase group 34. Each phase output voltage is a sum of the output voltages of the power cells 28 in the phase group 30, 32 and 34 as described before with reference to FIG. 1. The power circuit 16 delivers a medium voltage output to the load 12 using lower voltage rated power cells 28 that include components rated to lower voltage standards. Each power cell 28 is coupled, e.g., for example via optical fiber communication link(s), to the controller 18, which can use current feedback and voltage feedback to control operation of the power cells 28.

It should be noted that in FIG. 1 and FIG. 2 the number of power cells 26, 28 in each phase group 30, 32, 34 can be between 2 and 12 to provide different medium voltage outputs as required by the load 12. As noted, before, in the embodiment of FIG. 1, the number of secondary windings of transformer 14 matches the number of power cells 26. In the embodiment of FIG. 2, a number of diode bridges and transformer secondary windings can vary from 1 to 6 to allow for harmonic cancellation on the primary side of the transformer 24. It will be appreciated by those of ordinary skill in the art that other cell counts, and diode bridge counts may be used depending upon the application and that the configurations shown and described herein are intended to be exemplary in natures.

Figure 3:
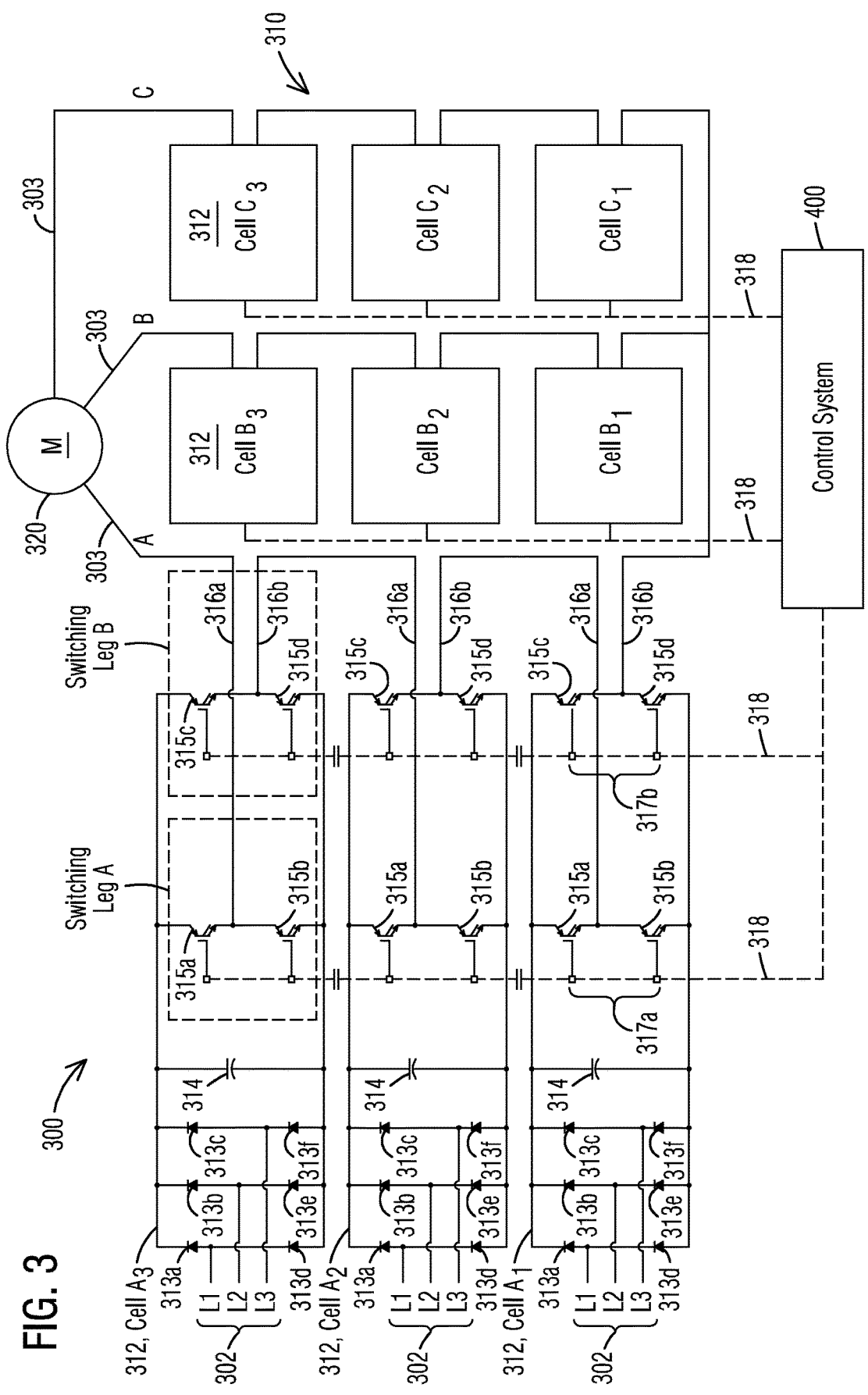
FIG. 3 illustrates a schematic diagram of a drive system in accordance with an exemplary embodiment disclosed herein.

FIG. 3 illustrates a schematic diagram of a drive system 300 comprising cascaded H-bridge multilevel converter 310 having a seven-level topology, including three phases with three power cells per phase, which additionally incorporates a control system 400 in accordance with an aspect of the present disclosure. An example of a cascaded H-bridge multilevel converter 310 is the Perfect Harmony GH180® drive manufactured by Siemens Industry, Inc.

In the example of FIG. 3, the system 300 is a medium voltage drive comprising a three-phase power source providing a power input 302 via lines L1, L2 and L3. The multilevel converter 310 is connected to the AC power input 302 and produces a three-phase AC power supply as output 303, via output phases A, B and C. The AC output 303 can be connected to a load 320, which in this example comprises an electric motor. The motor 320 may be operated by controlling the frequency and/or amplitude of the output voltage produced by the multilevel converter 310.

Each phase of the multilevel converter 310 comprises a respective phase leg formed from a plurality of power cells 312 arranged in a cascaded manner. In the example of FIG. 1, phase legs Leg A, Leg B are each formed from the same number of power cells 312, namely three, that are connected in series. Each power cell 312 of a phase is connected to the power input 302 via respective input lines L1, L2 and L3. Power to the input lines L1, L2, L3 may be provided, for example, via a multi-phase winding transformer.

The power cells 312 of the three phases are respectively labelled as cell $A_1$ through cell $A_3$, cell $B_1$ through cell $B_3$ and cell $C_1$ through cell $C_3$. Each power cell 312 is responsive to control signals from the control system 400, which include for example pulse width modulation (PWM) signals to alter voltage level and/or frequency output, resulting in a multilevel voltage waveform for each phase. The power cells 312 generally include power semiconductor switching devices, passive components (inductors, capacitors), control circuits, processors, interfaces, and other components for communicating with the control system 400, i.e. the power cells 312 operate based on signals from the control system 400.

Each of the power cells 312 include single-phase inverter circuitry connected to separate direct current (DC) sources produced by a rectification of the AC power input for each power cell 312 via input lines L1, L2, L3. In this example, the rectification is carried out by diode rectifiers 313a-f arranged in a bridge rectifier configuration. The present example also uses filtering circuitry including, for example, a capacitor 314, for smoothing out voltage ripples from the rectified DC power.

The inverter circuitry of each cell 312 comprises power semiconductor switching devices 315a-d arranged in an H-bridge, also referred to as full bridge, configuration. The switching devices 315a-d may include, for example and without limitation, power transistors such as insulated-gate bipolar transistors (IGBT). The switching devices 315a, 15b connect to cell output line 316a while the switching devices 315c, 315d connect to cell output line 316b. The transistors 315a-d receive pulse width modulation signals, for example, in the form of gate input signals 318 controlled by the control system 400 based on pulse width modulation. The control system 400 selects either of transistors 315a or 315b to be ON via a first switching leg 317a, and either of transistors 315c or 315d to be ON via a second switching leg 317b, which will permit power to pass to the load 320 by way of the line 316a or 316b respectively. In other words, a controller triggered switching event of the switching leg 317a causes one of the transistors 315a, 315b to be in an ON state and the other to be in OFF state. Likewise, a controller triggered switching event of the switching leg 317b causes one of the transistors 315c, 315d to be in an ON state and the other to be in OFF state. In the embodiments illustrated, the switching legs 317a, 317b of an individual cell 312 are simply referred to as switching leg A and switching leg B of that individual cell 312.

Each of the power cells 312 may be constructed internally to low-voltage standards, despite its inclusion in a medium-voltage apparatus drive 300. By way of example, each power cell 312 may have a 600-volts rating. Thus, the maximum voltage level that can be output by each of the power cells 312 is about 600 VDC. Depending on which transistors are ON, the output voltage across the cell output lines 316a, 316b of each power cell 312 may be of either polarity or zero. Thus, each power cell 312 can have three output states: +600 VDC, −600 VDC, or ZERO VDC. Due to the serial connection between three power cells 312 in each phase output line, such as, for example, cells $A_1, A_2, A_3$ to the output phase A, it is possible to produce a maximum output voltage magnitude of about 1800 VDC for the respective phase output line. Each power cell 312 may be operated independently of another. Therefore, it is possible to provide at least seven voltage levels per phase to motor 320. The approximate values of these line-neutral voltage states include +/−1800 VDC, +/−1200 VDC, +/−600 VDC and ZERO VDC.

The electric motor 320 may comprise any type AC-type motor, for example, synchronous, asynchronous, permanent magnet, and may be rated for low voltage, medium voltage or high-voltage. For example, medium-voltage AC motors, such as those used in industrial process control, may operate in the 4.16 kV to 13.8 kV range. Greater or lesser voltage may be used. More than one motor 320 may be connected. Other loads may be used instead of or in addition to the motor 320. The motor 320 responds to the voltage applied by the multilevel converter on the three phases, for example, to increase, decrease or maintain a speed or position.

Figure 4:
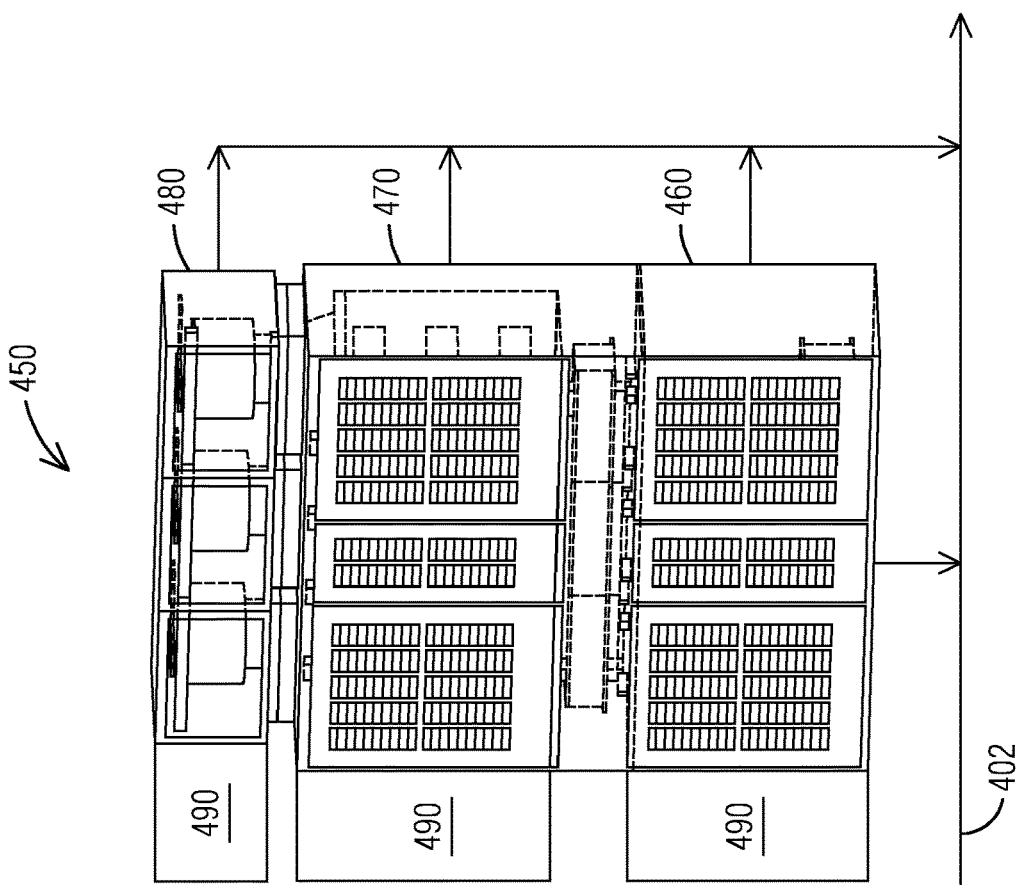
FIG. 4 illustrates a schematic diagram of drive system with a control system in accordance with an exemplary embodiment of the present disclosure.
Figure 4:
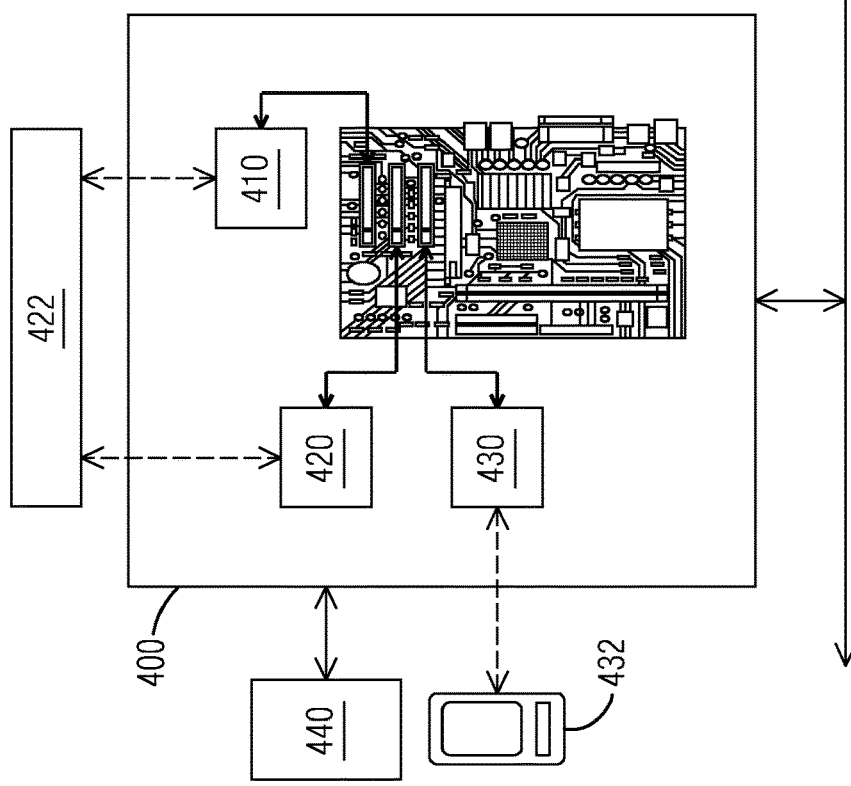

FIG. 4 illustrates a schematic diagram of drive system 450 with a control system 400 in accordance with an exemplary embodiment of the present disclosure.

As described before, for example with reference to FIG. 1 and FIG. 2, a drive system 450 such as a medium voltage variable frequency drive typically comprises a power transformer 460, a power (electronics) converter 470, a control system 400, herein also referred to as controller 400, and one or more cooling assemblies 480. The one or more cooling assemblies 480 may be configured as air-cooling assembly, as water-cooling assembly or a combination of both. The power transformer 460 converts an input medium voltage, for example between 1 kV-33 kV, to a usable voltage for the power converter 470, such as for example 480V-1500V. The power converter 470 converts the secondary-side voltage from the power transformer 460 using stages for rectification and inversion to provide a variable frequency, for example between 0 Hz-500 Hz and a variable voltage, for example between 0V-14.4 kV, at the output. In an embodiment, the power converter 470 may comprise multiple power cells as described before. The controller 400 of the drive system 450 regulates and controls operation of the drive components via a data connection, such as data bus 402, to provide a required frequency and voltage at the output based on commands, for example previously stored in the controller 400 or received from an external control system, such as a customer control system. In addition, the controller 400 performs drive protection functions and provides drive status to the customer or user of the drive system 450.

For operation of the drive system 450, the control system 400, herein also referred to as master or central control system 400, includes a field programmable gate array (FPGA), a control processor in communication with the FPGA, an electrically programmable logic device (EPLD), and a host. The master control system 400 also includes a parallel bus, and the FPGA, the EPLD, and the host are each connected to the parallel bus. According to various embodiments, the FPGA is RANI-based and is configured for communication with one or more digital-to-analog converters (DAC), one or more an analog-to-digital converters (ADC), a power cell bypass system, a plurality of power cells, an encoder, one or more input/output interfaces, and an internal network. Further details of known functions and elements of a control system 400 are not further described herein.

Further, drive system 450 comprises a plurality of sensors 490 (only shown schematically and collectively for the system 450), to monitor various characteristics and values of the drive system 450. For example, the sensors 490 include sensor for measuring and monitoring input voltage, output voltage, input current, output current of the power converter 470, internal temperatures the transformer 460 and/or power converter 470 and/or cooling assemblies 480. An addition of sensors 490 that monitor coolant flow and coolant pressure drop between cooling outlet and inlet of the cooling assembly 480, and sensors 490 that monitor vibration of the drive system 450, for example vibration of the transformer 460 or power converter 470, allow access to information and data that may be used to provide the predictive maintenance capability and diagnostic capability. The sensors 490 provide sensor data, such as values and/or measurements of temperature, vibration, current and voltage via data bus 402 to the control system 400.

Further, drive system 450 comprises one or more reduced order models 440 received and stored by the controller 400. A reduced order model 440, also referred to as ROM, can be defined as a simplification of a high-fidelity dynamical model that preserves essential behavior and dominant effects for the purpose of reducing solution time or storage capacity required for the more complex model. The drive system 450 may comprise for example a ROM of the power converter 470 and/or a ROM of the transformer 460.

Utilizing the plurality of sensors 490 and the one or more reduced order models (ROMs) 440, the drive system 450 provides an improved control system 400 and an improved control method. The improved drive system 450 includes artificial intelligence capabilities. Such artificial intelligence capabilities may include for example self-learning capabilities, predictive maintenance capabilities and mobile applications (hereinafter also referred to as "mobile apps") capabilities. Thus, the controller 400 comprises self-learning module 410, preventive maintenance module 420 and mobile applications module 430. The self-learning module 410 and preventive maintenance module 420 are configured to connect to communication networks, such as an Intranet (of the drive provider or the drive customer), Internet, Ethernet etc. for data mining, data cluster analysis etc. The mobile applications module 430 is configured to connect to a mobile device 432, such as a smartphone or tablet, so that the control system 400 may receive input such as commands from the module 430 via a mobile application of the mobile device 432, if such capability is enabled by a customer or user of the drive system 450. As a rule, a mobile device application 430 may be used to obtain current performance data, maintenance data while the main control of the drive operation will still reside with the main control logic of the controller 400. For example, the preventive maintenance module 420 and mobile applications module 430 allow adding or loading of further applications, for example customer specific applications, to the controller 400 which provide postprocessing of drive data independently from a control process performed by the control system 450. In another example, the further application or control features may be loaded, added and/or enabled remotely, for example wireless, for example by the drive provider following software upgrades that are purchased later on by the customer or user.

With the modules 410, 420, 430, sensor values provided by the sensors 490 and the ROMs 440, the drive system 450 provides adaptive response(s) to allow optimal operation of the drive system 450, preventive maintenance of various components of the drive system 450, and access to data mining tools and large data analysis. The improved drive system 450 and controller 400 will be described in more detail with reference to the following figures.

Figure 5:
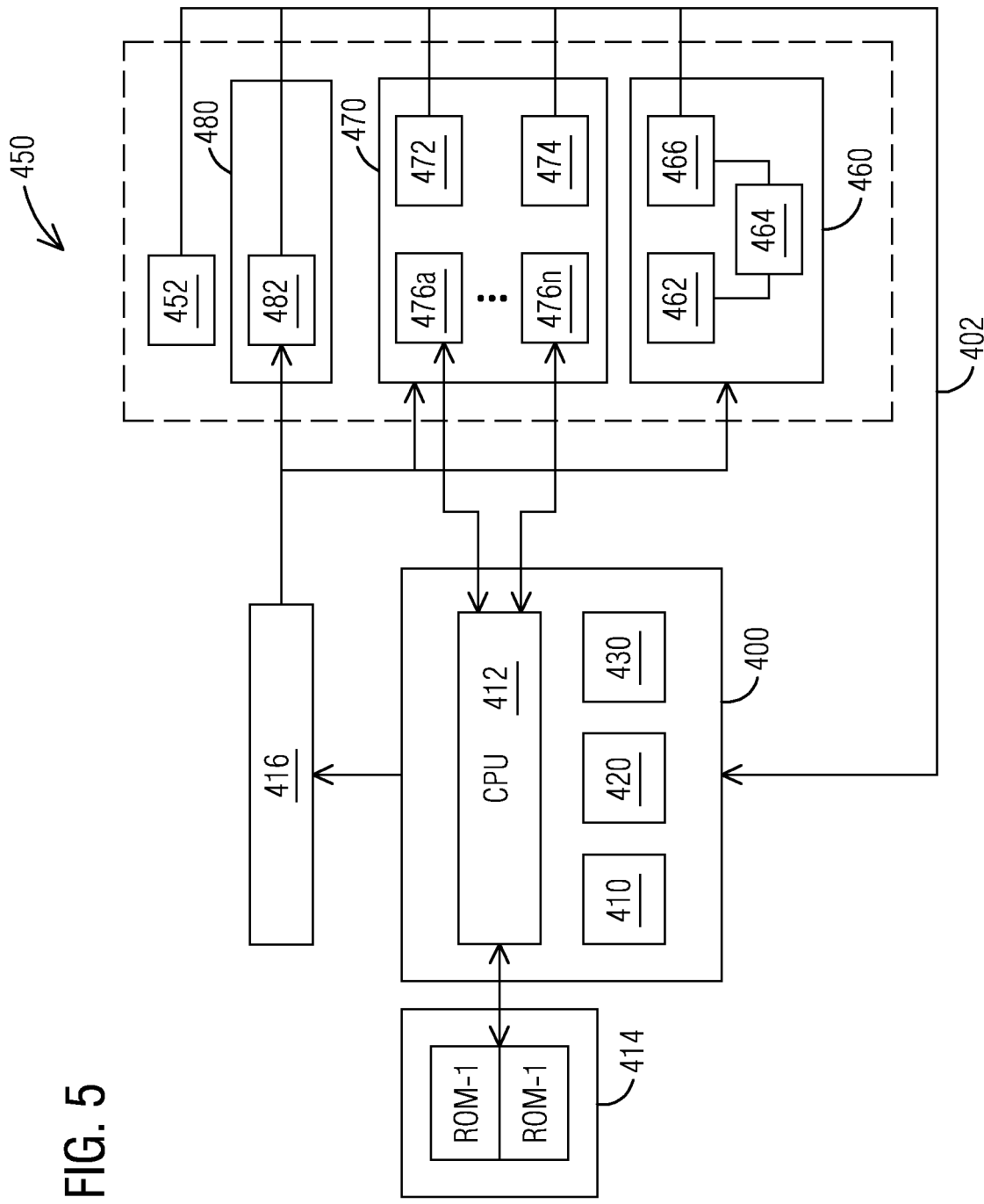
FIG. 5 illustrates a schematic diagram of control system utilizing reduced order models in accordance with an exemplary embodiment of the present disclosure.

FIG. 5 illustrates a schematic diagram of control system 400 utilizing reduced order models (ROMs) in accordance with an exemplary embodiment of the present disclosure.

FIG. 5 illustrates schematically transformer 460, power converter 470 and cooling assembly 480 of a drive system. The control system 400 (or short controller 400) comprises multiple components comprising first reduced order model ROM-1 and second reduced order model ROM-2. Further, the controller 400 comprises at least one processor 412, such as a central computing unit (CPU), executing computer readable instructions. The controller 400 may herein also be referred to as central controller 400 of the drive system 450.

The transformer 460, power converter 470 and cooling assembly comprise multiple sensors. For example, the power converter 470 comprises a heat sink sensor 472 for measuring an internal relevant temperature of a heat sink and an air flow sensor 474 for measuring an internal relevant air flow of the power converter 470. Further, the power converter 470 is configured to monitor and evaluate an actual power dissipated inside semiconductor switches and/or monitors a temperature of capacitors, such as for example power dissipated inside the capacitors.

The transformer 460 may comprise sensor 462 for measuring a temperature at predefined locations on secondary windings of the transformer 460 and sensor 464 for measuring a temperature of a core of the transformer 460. The transformer 460 may further comprise an optical sensor 466 located at primary windings for the purposes of arc fault detection.

The cooling assembly 480 may comprise sensors 482 for monitoring coolant flow and coolant pressure drops between cooling fluid outlet and cooling fluid inlet.

The drive system 450 further comprises one or more vibration sensors 452 monitoring vibration of components of the drive system 450, such as the transformer 460, power converter 470 and cooling assembly 480, in order to determine mechanical conditions that require maintenance.

In an exemplary embodiment, the drive system 450 a first reduced order model ROM-1 which is a computational fluid dynamic (CFD) reduced order model of the power converter 470. The reduced order model ROM-1 of the power converter 470 in essence is a multidimensional response surface. It may have multiple inputs and multiple outputs. For example, ROM-1 for power converter 470 may have 3 (three) inputs and any number of outputs, depending on semiconductor devices that are used. The inputs to consider may be ambient temperature, air flow rate and dissipated power rate. The outputs may include junction temperatures for all individual transistors inside the semiconductor switches, such as insulated-gate bipolar transistors (IGBTs). Since IGBTs are potentially different, the number of individual transistors inside varies, typically between 4 and 12. A temperature of a heatsink at a fixed location inside the power converter 470 which is associated with an actual measuring device (thermal probe), may also be included in the output set.

The ROM-1 may be obtained via complex CFD software simulations. The input parameters, mainly air flow rate and dissipated power rate, are varied and given a number of fixed values, for example 5 (five) fixed values for the air flow rate and 5 (five) fixed values for dissipated power. Thus, with 5 power values and 5 air flow values, a total of 5*5=25 simulations is provided. For each simulation, all output values are recorded in the ROM-1. The net result of this process is a multidimensional lookup table with 3 (three) inputs and a variable number of output temperatures as described above. There may not be a need to run the ROM-1 at different values for the input ambient temperate because the effect of this parameter would mainly be to scale up and down the output temperatures.

The ROM-1 may be included in a system level simulation software such that when the inputs are varied between the simulated ranges, outputs would be continuously available due to interpolation between the simulated points. For example, a linear or spline interpolation may be used.

The ROM-1 is loaded and stored in a drive control memory 414, which may be a memory external to the controller 400 or a memory within controller 400.

In an exemplary embodiment, the at least one processor 412 is configured via executable instructions to access or to receive the first reduced order model ROM-1, to receive the sensor values provided by the plurality of sensors 452, 462, 464, 472, 474, 482, 484, to analyze the sensor values in connection with the ROM-1 to determine one or more operating modes 416, and to output one or more determined operating modes 416. To analyze the sensor values in connection with the first reduced order model ROM-1 comprises for example inputting the sensor values in the ROM-1, performing computations of the ROM-1 and obtaining output values of the ROM-1 based on actual sensor values used as input values. Analyzing may also comprise comparing the sensor values to certain values of the first reduced order model ROM-1 without performing/running complete simulations of the ROM-1.

Operating modes 416 as used herein may include operating modes that describe a current state of the system 450 including for example temperatures at certain locations, specifically detecting hot spots of the system 450. Such detected hot spots may trigger an alarm to be issued by the control system 400. Operating modes 416 may also include modified operation modes proposed by the control system 400 for example to increase efficiency of the system 450 or reduce costs for operating the system 450.

Operating modes 416 determined by the control system 400 may include for example modified operating modes of the power converter and/or modified operating modes of the cooling assembly 480. For example, a modified operating mode 416 of the power converter 470 includes for example modifying output voltage by increasing or decreasing the output voltage based on the analyzed sensor values and the reduced order model ROM-1. For example, if evaluation of the air flow rate and dissipated power rate in the semiconductor switches is below the corresponding calculated values in the first reduced order model ROM-1, operation of the power converter 470 may be changed so that the power converter 470 outputs more voltage and/or cooling of the power converter 470 by the cooling assembly 480 may be reduced. On the contrary, when evaluated that sensor values are higher that corresponding calculated temperature values in the ROM-1, operation may be changed so that the power converter 470 outputs less voltage and/or that cooling of the power converter 470 may be increased by the cooling assembly 480.

For example, the ROM-1 is accessed, by the at least one processor 412, to evaluate certain temperatures of chosen locations inside the IGBTs of the power converter 470 based on actual inputs, such as actual power dissipated inside the IGBTs, which is a value that the power converter 470 can evaluate constantly, and the air flow measured by sensor 474. Such output values of the IGBTs locations, hot spots actually, may be retrieved and alarms issued if necessary.

In another embodiment, temperature(s) of capacitor(s) of the power converter 470 may also be monitored by one or more sensors and included in the first reduced order model ROM-1 to monitor and evaluate temperature(s) of the capacitor(s) if desired. In this case, capacitor inputs may be input current of a capacitor and dissipation rate, wherein an output may be hot spot temperature.

As described before, the controller 400 comprises self-learning capabilities utilizing the self-learning module 410. Thus, in another embodiment of the present disclosure, the control system 400 comprising the at least one processor 412 is further configured to compare an actual temperature measured by the heat sink sensor 472 to a calculated temperature of the heat sink included in the first reduced order model ROM-1, and to update the first reduced order model ROM-1 with the actual temperature of the heat sink if a difference between the actual temperature value and the calculated temperature value has been determined. An algorithm for correcting or updating the temperature value passes through an intelligent controller such as a neural network or a fuzzy controller ultimately responsible for updating the first reduced order model ROM-1 if necessary.

Thus, an accuracy of electronic components is improved via the self-learning capabilities which may be used to reliably estimate lifespan(s) of the electronic components.

In another exemplary embodiment, the drive system 450 comprise further reduced order models. For example, the drive system 450 may comprise a second reduced order model ROM-2 of the transformer 460 which is loaded and stored in memory 414. The control system 400 comprising the at least one processor 412 is further configured via executable instructions to receive the second reduced order model (ROM-2) of the transformer 460, to receive values of transformer-related sensors 462, 464, and to analyze the sensor values in connection with the second reduced order model ROM-2 to determine the one or more operating modes 416.

The second reduced order model ROM-2 is obtained via computational fluid dynamic simulations comprising multiple input parameters and multiple output parameters. Since transformers 460 are quite different depending on how they are built there may be a separate reduced order model ROM-2 for each transformer design. Input quantities may be power losses assumed to be equally distributed to phases of the transformer (typically three phases) and air flow through each phase leg. Output quantities may be temperatures at critical locations on secondary windings and at least one location of a core of the transformer 460. It should be noted that the drive system 450 may comprise further reduced order models in addition to first and second reduced order models ROM-1, ROM-2.

In an embodiment, data of the various sensors 452, 462, 464, 472, 474, 482, outputs, such as output operating modes 416, from the controller 400 and predictive algorithms and the reduced order models ROM-1, ROM-2 can be continuously collected and retrieved. For example, the drive system 450 comprises a connection interface to an external storage medium 418. The connection can be for example an external network, such as Internet, Intranet or Ethernet of a user of the drive system 450, for example a customer or supplier. The collected and retrieved data can be post-processed to gain more information to enhance drive and system performance, run learning algorithms and predict long term effects.

The drive system 450, specifically the control system 400, is further configured to include mobile application capabilities utilizing mobile applications module 430 to allow a user, such as a customer of the drive system 450, to access data that is resident on the drive system 450 and run mobile applications that generate customer specific outputs. Such mobile applications are provided on a handheld device, such as a smartphone, tablet, or like device, that permits a user to walk freely without wired tethering. Utilizing such a mobile application, the user/customer can modify or adapt operation of the drive system 450, for example to operate the drive system 450 more efficiently. For example, the control system 400 may analyze various sensor values in view of the reduced order models ROM-1, ROM-2 and may determine that the cooling assembly 480 may provide more cooling than actually necessary based on evaluated temperatures in the power converter 470. The user/customer may reduce cooling of the cooling assembly 480 via the mobile application and the mobile applications module 430. Thus, with the mobile applications module 430, certain features of the drive system 450 can be enabled remotely.

In another exemplary embodiment of the present disclosure, each power cell 312 of the power converter 470 (see FIG. 1, FIG. 2 or FIG. 3) comprises a local control circuit 476a . . . 476n (only shown schematically) in communication with the control system 400. Further, each power cell 312 may comprise local sensors, respectively, wherein each local control circuit 476*i* . . . 476*n* collects sensor values of the local sensors and may evaluate the sensor values locally and/or may transmits the sensor values to the central control system 400 for evaluation. The local sensors may provide vibration values, arc detection values, temperature values and air-flow values etc. By providing local sensors and local control circuits 476*a* . . . 476*n*, a "distributed intelligence" is provided and operating states and modes of the individual power cells 312 can be monitored and determined more accurately.

For example, each local control circuit 476*a* . . . 476*n* comprises at least one processor configured via executable instructions to calculate a lifespan of power electronic components of each power cell 312 based on the vibration values, arc detection values, temperature values and air-flow values.

Vibration monitoring allows determination, for example by the central control unit 400, whether a mechanical condition is present that requires maintenance based on data provided by local vibration sensors. Arc detection values provided by local arc sensors, configured for example as optical sensors, may provide information of internal faults that may not be visible to the central control unit 400. Outputs of local air-flow sensors may be used to determine if adequate air-flow is available for each power cell 312 and to predict a temperature of each local heatsink. Local temperature sensors provide local temperature values utilized for the computations for the CFD ROM of the power converter 470 as described before. Utilizing the ambient conditions of each power cell 312, such as temperature, air-flow, power output etc., a prediction of the lifespan of the power electronic components can be made.

The data received from the various sensors, outputs from the drive control system 400 and from the power cells 312 along with the outputs from the predictive algorithms and ROM-1, ROM-2, can be used by the drive system 450 to adapt to changing conditions such as clogged air-filters or clogged coolant pipes, hotter or colder ambient temperatures or other feedback from the power cells. As described before, such an adaptive response may include changing a speed of cooling fans and/or cooling pumps, and/or remove, i.e. bypass, a certain power cell depending on its operating condition(s).

FIG. 6 illustrates a flow chart 600 of a method for controlling a variable frequency drive 450 in accordance with an exemplary embodiment of the present disclosure.

Referring now to FIG. 6, a methodology 600 is illustrated that facilitates controlling function. While the methodology is described as being a series of acts that are performed in a sequence, it is to be understood that the methodology may not be limited by the order of the sequence. For instance, unless stated otherwise, some acts may occur in a different order than what is described herein. In addition, in some cases, an act may occur concurrently with another act. Furthermore, in some instances, not all acts may be required to implement a methodology described herein.

The methodology may start at 602 and may include an act 604 of accessing a reduced order model ROM-1, ROM-2 of a power converter 470, and an act 606 of receiving a sensor value of the power converter 470 provided by a sensor 490. The methodology may also include an act 608 of analyzing the sensor value in connection with the reduced order model ROM-1, ROM-2 to determine an operating mode 416 of the power converter 470. Also, the methodology may include an act 610 of outputting the operating mode 416. At 612, the methodology may end.

It should be appreciated that this described methodology 600 may include additional acts and/or alternative acts corresponding to the features described previously with respect to the drive system 450 (see FIG. 4 and FIG. 5).

For example, the methodology 600 may include an act of comparing an actual value measured by the sensor 490 to a calculated value included in the reduced order model ROM-1, ROM-2, and may include an act of updating the reduced order model ROM-1, ROM-2 with the actual value when a difference between the actual value and the calculated value is determined.

Further, the methodology 600 may further include an act of obtaining the reduced order model ROM-1, ROM-2 of the power converter 470 via computational fluid dynamic simulations comprising multiple input parameters and multiple output parameters, wherein the multiple output parameters comprise calculated junction temperatures of individual transistors of switching devices 315*a*-*d* of power cells 312.

In another example, the methodology 600 may include an act of accessing a second reduced order model ROM-2 of a transformer 460, an act of receiving a sensor value of the transformer 460 provided by a sensor 490, an act of analyzing the sensor value in connection with the second reduced order model ROM-2 to determine an operating mode 416 of the transformer 460, and an act of outputting the operating mode 416.

The methodology may further comprise an act of communicating with local control circuits 476 of the power cells 312, each local control circuit 476 collecting sensor values of local sensors of the power cells 312, and an act of analyzing 630 the sensor values in connection with the first reduced order model ROM-1 to determine an operating mode 416 of the power converter 470.

It should be appreciated that acts associated with the above-described methodologies, features, and functions (other than any described manual acts) may be carried out by one or more data processing systems, such as for example central control system 400, via operation of at least one processor 412. As used herein a processor corresponds to any electronic device that is configured via hardware circuits, software, and/or firmware to process data. For example, processors described herein may correspond to one or more (or a combination) of a microprocessor, CPU, or any other integrated circuit (IC) or other type of circuit that is capable of processing data in a data processing system. As discussed previously, the processor 412 that is described or claimed as being configured to carry out a particular described/claimed process or function may correspond to a CPU that executes computer/processor executable instructions stored in a memory in form of software and/or firmware to carry out such a described/claimed process or function. However, it should also be appreciated that such a processor may correspond to an IC that is hard wired with processing circuitry (e.g., an FPGA or ASIC IC) to carry out such a described/claimed process or function.

In addition, it should also be understood that a processor that is described or claimed as being configured to carry out a particular described/claimed process or function may correspond to the combination of the processor 412 with the executable instructions (e.g., software/firmware apps) loaded/installed into a memory (volatile and/or non-volatile), which are currently being executed and/or are available to be executed by the processor 412 to cause the processor 412 to carry out the described/claimed process or function.

Thus, a processor that is powered off or is executing other software, but has the described software installed on a data store in operative connection therewith (such as on a hard drive or SSD) in a manner that is setup to be executed by the processor (when started by a user, hardware and/or other software), may also correspond to the described/claimed processor that is configured to carry out the particular processes and functions described/claimed herein.

In addition, it should be understood, that reference to "a processor" may include multiple physical processors or cores that are configures to carry out the functions described herein. Further, it should be appreciated that a data processing system may also be referred to as a controller that is operative to control at least one operation.

It is also important to note that while the disclosure includes a description in the context of a fully functional system and/or a series of acts, those skilled in the art will appreciate that at least portions of the mechanism of the present disclosure and/or described acts are capable of being distributed in the form of computer/processor executable instructions (e.g., software and/or firmware instructions) contained within a data store that corresponds to a non-transitory machine-usable, computer-usable, or computer-readable medium in any of a variety of forms. The computer/processor executable instructions may include a routine, a sub-routine, programs, applications, modules, libraries, and/or the like. Further, it should be appreciated that computer/processor executable instructions may correspond to and/or may be generated from source code, byte code, runtime code, machine code, assembly language, Java, JavaScript, Python, Julia, C, C#, C++ or any other form of code that can be programmed/configured to cause at least one processor to carry out the acts and features described herein. Still further, results of the described/claimed processes or functions may be stored in a computer-readable medium, displayed on a display device, and/or the like.

The invention claimed is:

1. A variable frequency drive system comprising:
 a power converter comprising a plurality of power cells supplying power to one or more output phases, each power cell comprising multiple switching devices incorporating semiconductor switches;
 a plurality of sensors monitoring values of the power converter; and
 a control system in communication with the power converter and controlling operation of the plurality of power cells, the control system comprising at least one processor configured via executable instructions to
  access a first reduced order model of the power converter;
  receive the values provided by the plurality of sensors;
  analyze the values in connection with the first reduced order model to determine one or more operating modes; and
  output one or more determined operating modes of the power converter.

2. The variable frequency drive system of claim 1, wherein the plurality of sensors provide internal temperature values of the semiconductor switches of the power converter.

3. The variable frequency drive system of claim 1, wherein the plurality of sensors comprise a heat sink sensor measuring an internal temperature of a heat sink and an air flow sensor measuring an internal air flow of the power converter.

4. The variable frequency drive system of claim 1, wherein the plurality of sensors provide temperature values of capacitors of the power converter.

5. The variable frequency drive system of claim 1, wherein the first reduced order model is obtained via computational fluid dynamic simulations comprising multiple input parameters and multiple output parameters, wherein the multiple output parameters comprise calculated junction temperatures of individual transistors of the switching devices of the power cells and a calculated temperature of the heat sink of the power converter.

6. The variable frequency drive system of claim 1, further comprising a cooling assembly for cooling the power converter, wherein the plurality of sensors further comprise sensors for monitoring coolant flow and coolant pressure drops between cooling fluid outlet and cooling fluid inlet.

7. The variable frequency drive system of claim 1, wherein the plurality of sensors further comprise vibration sensors monitoring vibration of components of the drive system in order to determine mechanical conditions that require maintenance.

8. The variable frequency drive system of claim 1, further comprising a transformer operably coupled to the power converter and providing isolated voltage to the plurality of power cells,
 wherein the control system comprising the at least one processor is further configured via executable instructions to
  access a second reduced order model of the transformer; and
  analyze the values in connection with the second reduced order model to determine the one or more operating modes.

9. The variable frequency drive system of claim 1, wherein the one or more operating modes comprise a state of the drive system including hot spots, and wherein the one or more operating modes comprise a modified operating mode of the cooling assembly and/or a modified operating mode of the power converter, wherein an output voltage of the power converter is increased or decreased.

10. The variable frequency drive system of claim 1, wherein each power cell comprises local sensors and a local control circuit in communication with the control system, wherein each local control circuit collects sensor values of the local sensors and transmits the sensor values to the control system for evaluation.

11. The variable frequency drive system of claim 1, wherein the control system further comprises a preventive maintenance module and a mobile applications module which allow adding or loading further applications to the control system which provide postprocessing of drive data independently from a control process performed by the control system.

12. The variable frequency drive system of claim 5, wherein the control system comprising the at least one processor is further configured via executable instructions to
 compare an actual temperature measured by the heat sink sensor to a calculated temperature of the heat sink included in the first reduced order model; and
 update the first reduced order model with the actual temperature of the heat sink when a difference between the actual temperature value and the calculated temperature value is determined.

13. The variable frequency drive system of claim 8, wherein the second reduced order model is obtained via computational fluid dynamic simulations comprising multiple input parameters and multiple output parameters, wherein the multiple output parameters comprise calculated temperatures at predefined locations on secondary windings and a core of the transformer.

14. The variable frequency drive system of claim 10, wherein the local sensors provide vibration values, arc detection values, temperature values and air-flow values.

15. The variable frequency drive system of claim 10, wherein each local control circuit comprises at least one processor configured via executable instructions to calculate a lifespan of power electronic components of each power cell based on the vibration values, arc detection values, temperature values and air-flow values.

16. The variable frequency drive system of claim 11, wherein the preventive maintenance module and mobile applications module are configured so that the further applications or control features are added, loaded or enabled remotely.

17. A method for controlling a variable frequency drive comprising through operation of at least one processor:
    accessing a first reduced order model of a power converter;
    receiving a sensor value of the power converter provided by a sensor;
    analyzing the sensor value in connection with the first reduced order model to determine an operating mode of the power converter; and
    outputting the operating mode.

18. The method of claim 17, further comprising:
    comparing an actual value measured by the sensor to a calculated value included in the reduced order model; and
    updating the reduced order model with the actual value when a difference between the actual value and the calculated value is determined.

19. The method of claim 17, further comprising:
    obtaining the reduced order model of the power converter via computational fluid dynamic simulations comprising multiple input parameters and multiple output parameters, wherein the multiple output parameters comprise calculated junction temperatures of individual transistors of switching devices of power cells.

20. The method of claim 17, further comprising:
    accessing a second reduced order model of a transformer; and
    receiving a sensor value of the transformer provided by a sensor;
    analyzing the sensor value in connection with the second reduced order model to determine an operating mode of the transformer; and
    outputting the operating mode.

* * * * *